United States Patent [19]
Yi

[11] Patent Number: 5,970,085
[45] Date of Patent: Oct. 19, 1999

[54] METHOD AND RECEIVER FOR CODED SATELLITE DIGITAL AUDIO BROADCASTING

[75] Inventor: Byung Kwan Yi, Derwood, Md.

[73] Assignee: Orbital Sciences Corporation, Dulles, Va.

[21] Appl. No.: 09/061,255

[22] Filed: Apr. 17, 1998

Related U.S. Application Data

[62] Division of application No. 08/908,045, Aug. 11, 1997, Pat. No. 5,907,582.

[51] Int. Cl.$^6$ ...................................................... H04B 1/69
[52] U.S. Cl. .......................... 375/200; 375/347; 370/342; 370/542
[58] Field of Search .................................... 375/200, 202, 375/206, 259, 267, 347; 370/342, 542

[56] References Cited

U.S. PATENT DOCUMENTS

| | | |
|---|---|---|
| 5,191,598 | 3/1993 | Backstrom et al. ..................... 375/347 |
| 5,278,863 | 1/1994 | Briskman ................................. 375/200 |
| 5,319,673 | 6/1994 | Briskman ................................. 375/200 |
| 5,406,570 | 4/1995 | Berrou et al. ........................... 714/792 |
| 5,408,502 | 4/1995 | How ......................................... 375/340 |
| 5,438,590 | 8/1995 | Tzukerman et al. .................... 375/259 |
| 5,446,747 | 8/1995 | Berrou .................................... 714/788 |
| 5,485,485 | 1/1996 | Briskman et al. ...................... 375/200 |
| 5,544,156 | 8/1996 | Teder et al. ............................. 370/342 |

*Primary Examiner*—Young T. Tse
*Attorney, Agent, or Firm*—McDermott, Will & Emery

[57] ABSTRACT

A system and method for broadcasting an audio signal in a turbo-coded satellite digital audio broadcasting system is provided that utilizes the combination of a turbo coding system having code combining and code diversity techniques to lower the power required for transmittal and to transmit at a higher code rate of ¼ by utilizing the puncturing sequence and a pilot signal assisted orthogonal CDMA; the invention includes an improved receiver system that uses modified RAKE receivers in order to mitigate the Rayleigh multipath fading, shadowing, and temporal blockage and improve performance. The invention further uses a terrestrial gap filler network having a reduced amount of gap fillers.

20 Claims, 6 Drawing Sheets

METHOD AND RECEIVER FOR CODED SATELLITE DIGITAL AUDIO BROADCASTING

This application is a division of Ser. No. 08/908,045 filed Aug. 11, 1997, now U.S. Pat. No. 5,907,582.

BACKGROUND OF THE INVENTION

1. Field of the Invention

This invention relates to a Digital Audio Broadcasting (DAB) system for the wide-area distribution of multiple channels of audio programming, and in particular to a DAB system and method having improved receiver performance through coding gain from code diversity and packet combining, and distributed gap filler network.

2. Description of the Prior Art

Several DAB methods and systems have been proposed for Direct Broadcast Satellite Radio that essentially broadcasts digital audio signals for reception by fixed and mobile receivers. Such DAB systems and methods heretofore have yet to overcome problems that affect the overall system performance so as to make it commercially feasible. The most significant problems in DAB systems are signal shadowing, fading, and temporal blockage. Shadowing problems are dominated by factors such as the intermittent blockage of the line of sight to the receiver from the satellite by natural or man-made objects. For example, in suburban environments tree shadowing is the prominent signal impairment, while in urban environments, buildings cause the major shadowing effect. Fading problems are mainly caused by multipath signals to the mobile receiver in suburban and urban environments. Signal fading can be mitigated by adapting temporal diversity techniques such as time diversity and spatial diversity. Conventional time diversity schemes operate on the same signal so as to randomize the outage patterns through interleaving, data repetition, and/or some form of channel coding. Conventional spatial diversity techniques operate on the same signal using a dual satellite scheme and/or an antenna diversity technique for remedying shadowing and temporal blockages.

Conventional DAB systems and methods have sought to mitigate the problems of multipath fading and foliage attenuation by employing two geosynchronous satellites. U.S. Pat. Nos. 5,319,673 and 5,278,863 to Briskman disclose a polarization diversity technique in a spread spectrum system (either direct sequence or frequency hopping schemes) that employs frequency diversity to combat fading in a frequency selective channel. A conventional Code Division Multiple access (CDMA) system, using two geosynchronous satellites and a dual diversity technique is utilized, however, the Briskman system cannot provide seamless high performance service over the entire coverage area, since conventional CDMA system performance is limited by self-interference. Self-interference is induced by the cross-correlations of the Pseudo Noise (PN) sequences used for the different program channels. Furthermore, the Briskman system employs a dual polarization approach to separate signals from two satellites, the receiver then selecting the stronger of the two broadcasts of the same signal. While a dual satellite system increases the probability that a mobile or fixed receiver has line-of-sight contact with one of at least two satellites, the unselected satellite's signal must be separated and eliminated from further signal processing, otherwise, the weaker signal acts like added noise to the stronger signal. Additionally, preserving the polarization in the mobile signal path is very difficult because the reflected signals tend to invert the polarization. Therefore, conventional DAB systems are inefficient in power and bandwidth usage whereby performance is inadequate for subscription-grade quality of service.

Finally, even with two satellites, signal blockage, shadowing, and fading problems continue to occur in urban and suburban environments. Conventional DAB systems have sought to solve this problem by employing a network of gap filler transmitters to provide the signal when both satellites are blocked from view. However, such network of gap fillers transmitting the same broadcast signal increases the self-interference problem, which in turn increases the cost and complexity of the gap filler network because of the desire to use increased transmit power levels to combat self-interference. Previous attempts to solve this problem have been inadequate for subscription grade service given the intended DAB service area (continental United States) and the pervasiveness of the shadowing/fading problem; this has created new cost problems whereby gap fillers are required in virtually all urban and suburban locations. Therefore, the DAB method and system of the present invention advantageously provides a way to reduce the number and cost of such gap fillers and a critical solution to the overall network design problem. The DAB method and system of the present invention advantageously utilizes code diversity (whereby two different non-self-interfering turbo encoded signals are transmitted and substantially combined inside the receiver) to provide improved performance through higher coding gains, fewer gap fillers, and reduced transmit power level requirements from either of each of the satellite or the gap fillers.

Other DAB systems have used dual antennas and a Viterbi-algorithm method over a fading channel to reduce the affects of signal fading in the received signal. U.S. Pat. No. 5,191,598 to Bäckström et al. discloses a system for receiving radio signals on at least two mutually spaced antennas and a receiver to process samples of the signal using a Viterbi-algorithm thereby reducing signal fading. Various antenna diversity schemes also have been used and these are characterized by the orthogonal polarization of the broadcast signals. For example, in U.S. Pat. No. 5,485,485 to Briskman, a dual antenna system is disclosed that selects the stronger of two signals having substantially the same content and frequency. The dual antenna approach requires two physical antennas on the mobile receiving station which is inconvenient and expensive as multiple antennas are installed on the vehicle's roof, and their employment illustrates the severity of the reception problems of conventional DAB systems. Additionally, the performance gain due to a dual-antenna system is minimal unless the receiver uses extensive signal processing techniques to accurately compensate for the angle of arrival. The method and system of the present invention solves these problems by advantageously utilizing RAKE receivers to combine multipath signals from satellites and gap fillers at the DAB receiver.

U.S. Pat. No. 5,544,156 to Teder et al. discloses a system and method for coherently demodulating an uplink signal in a multirate, CDMA system. However, the receiver performance of the conventional CDMA and/or Viterbi based coding systems is limited by multiple access channel interference and does not provide performance and coding gains at the level provided by the present invention. As a result, the present invention uses a Turbo Code method and system along with Orthogonal Code Division Multiple Access (OCDMA) techniques to advantageously eliminate the effects of multiple access interference and provide high coding gain, which results in robust DAB reception at lower overall power levels.

Finally, an error coding system using turbo codes, ie., codes that associate with parallel concatenation of two convolutional codes separated by an interleaver, is disclosed in U.S. Pat. No. 5,446,747 to Berrou and U.S. Pat. No. 5,406,570 to Berrou et al. While such systems have acceptable coding gain they do not address the dual-signal path case or the benefits provided through the use of code combining and code diversity. These codes do not transmit interleaved data elements, but only transmit uninterleaved data elements and parity check elements from both uninterleaved and interleaved sequences. The present invention transmits uninterleaved and interleaved data elements with corresponding coded data elements to two separate signal paths, and at the turbo decoder, combines these two elements advantageously to achieve an effective overall code rate ¼ from the simultaneous reception and combination of two code rate ½ signals, thereby providing significantly improved performance.

The present invention is aimed at overcoming these different drawbacks of the prior art.

SUMMARY OF THE INVENTION

It is an object of the present invention to provide an improved DAB method and system using an implementation of turbo code over two complementary satellite links in the DAB system to allow the reduction of the satellite transmitter output power.

It is an object of the present invention to increase the coverage area with a minimum number of gap fillers using the high coding gain of the turbo code.

Another object of the present invention is to provide code diversity at a code rate of ½ coupled with packet combining to result in an overall system code rate of ¼. A code diversity scheme, coupled with a code combining scheme advantageously provides improved performance through very high coding gain, allows the reduction of transponder output power, and provides seamless service over the coverage area with a minimum number of required gap fillers. Code diversity and packet combining are used to mitigate Rayleigh multipath fading, shadowing, and temporal blockage.

Yet another object of the present invention is to provide a DAB system using a synchronous Orthogonal Code Division Multiple Access (OCDMA) scheme for DAB applications, e.g. CD Quality Radio, messaging transmission and Internet download server, so as to completely eliminate self interference from other audio channels encountered with the use of a conventional CDMA system.

Another object of the present invention is to provide a DAB system having dual RAKE receivers, arranged whereby one RAKE receiver is used to combine the satellite, gap filler, and multipath signals associated with each of two complementary satellite data streams.

It is a further object of the present invention to provide high powered pilot channels to assist the receiver to acquire synchronization of the signals from multiple satellites and gap filler transmitters.

Finally, the present invention can provide advantageously a terrestrial gap filler network for retransmission of the uplinked satellite signals in areas where there is a high probability that signals from both satellites might be blocked, with proper built-in signal propagation delay to compensate for the signal delay through the satellite path. A variable delay is applied to each gap filler signal so as to accommodate propagation delays on the satellite paths, including Doppler shift associated with the normally encountered daily motion of the satellites in their respective geosynchronous orbit locations. In this way, each gap filler transmitter in a given service area retransmits the same signals as the two satellites so as to align the satellite-delivered and gap filler delivered signals in time at each receiver in the gap filler's service area. So long as the delay spread is maintained to less than one bit period, orthogonality of the OCDMA signals is maintained at the RAKE receiver, and the satellite, gap filler, and multipath reflection signals can be combined in the receiver to overcome the problems of conventional systems.

Accordingly, the present invention provides a digital audio broadcasting (DAB) system adapted to broadcast signals of digital radio information and to reduce multipath fading, signal shadowing and temporal blockage having a broadcast source having a transmitter for transmitting a first turbo encoded broadcast signal and a second turbo encoded broadcast signal that includes the digital radio information, whereby the first and second turbo encoded broadcast signals are transmitted at a code rate of ½ on at least one predetermined path, for example, the first turbo encoded broadcast signal on a first path to a first satellite, the second turbo encoded signal on a second path to a second satellite source, and/or the first and second turbo encoded broadcast signals to a network of gap fillers that have delay circuitry for delaying the first and second turbo encoded broadcast signals to compensate for propagation signal delay through the first and second satellites. The first turbo encoded broadcast signal consists essentially of uninterleaved data and parity check elements. The second turbo encoded broadcast signal consists essentially of interleaved data and parity check elements. The system has at least one transmitter for transmitting the first and second turbo encoded broadcast signals on separate signal paths to each of the first and second satellite sources, respectively, and for transmitting the first and second satellite sources to the network of gap fillers. The system has a plurality of receivers for receiving the first and second turbo encoded broadcast signals, the receivers are located at or near the surface of the earth, each of the receivers has circuitry for outputting the digital radio information from the first and second turbo encoded broadcast signals. The receiver includes an antenna connected for receiving radio frequency (RF) signals consisting of spread signals of the first and second turbo encoded broadcast signals. The receiver has downconverter means for converting the RF signal to the baseband frequency of the first and second DAB encoded broadcast signals.

Accordingly the present invention provides a method of communicating an audio signal from a transmitter to a receiver using Turbo Coding in a digital audio broadcast (DAB) system. The method includes encoding the audio signal according to the Turbo Code at a ⅓ rate punctured to a code rate of ½, combining a first pilot signal and a predetermined number of channels of encoded audio signals using an orthogonal CDMA (OCDMA) modulator, whereby the OCDMA modulator consists essentially of an orthogonal Walsh sequence of $W_0, W_1, W_2, \ldots W_{31}$ to form a first turbo encoded broadcast signal containing the first pilot signal and the encoded audio signals of the predetermined channels, transmitting the first turbo encoded broadcast signal on a first path having the first pilot signal transmitted at a higher power. The method includes encoding the audio signal having been interleaved according to the Turbo Code at a ⅓ rate punctured to a rate of ½, combining a second pilot signal and the interleaved encoded audio signals of the channels using the OCDMA modulator, the OCDMA modulator consists essentially of an orthogonal Walsh sequence of $W_{32}$, $W_{33}, W_{34}, \ldots, W_{63}$ to form a second turbo encoded broadcast signal containing the second pilot signal and the interleaved encoded audio signal of the predetermined channels, and the second turbo encoded broadcast signal is transmitted on a second path having the second pilot signal $W_{32}$ transmitted at a higher power. The method includes, at the receiver, receiving the first and second turbo encoded broadcast signals, demodulating a selected channel of the first and second turbo encoded broadcast signals using said orthogonal Walsh sequence, whereby the demodulation of the first and second turbo encoded broadcast signals is adapted to use separate RAKE receivers so as to optimally combine the audio signal from the first and second turbo encoded signals received from the first and second paths. The method demultiplexes the first and second turbo encoded broadcast signals so as to separate systematic audio signals from multiplexed systematic sequences and parity sequences, and further the combining of an uninterleaved systematic sequence $X_1$ and interleaved systematic sequence $X_2$ in conjunction with a code diversity combining of the first and second turbo encoded broadcast signals achieves an overall code rate ¼.

BRIEF DESCRIPTION OF THE DRAWINGS

The features and advantages of the present invention will become more clearly appreciated from the following description, taken in conjunction with the accompanying drawings, in which like elements are denoted by like reference numerals and in which.

DETAILED DESCRIPTION OF THE PREFERRED EMBODIMENTS

Figure 1:
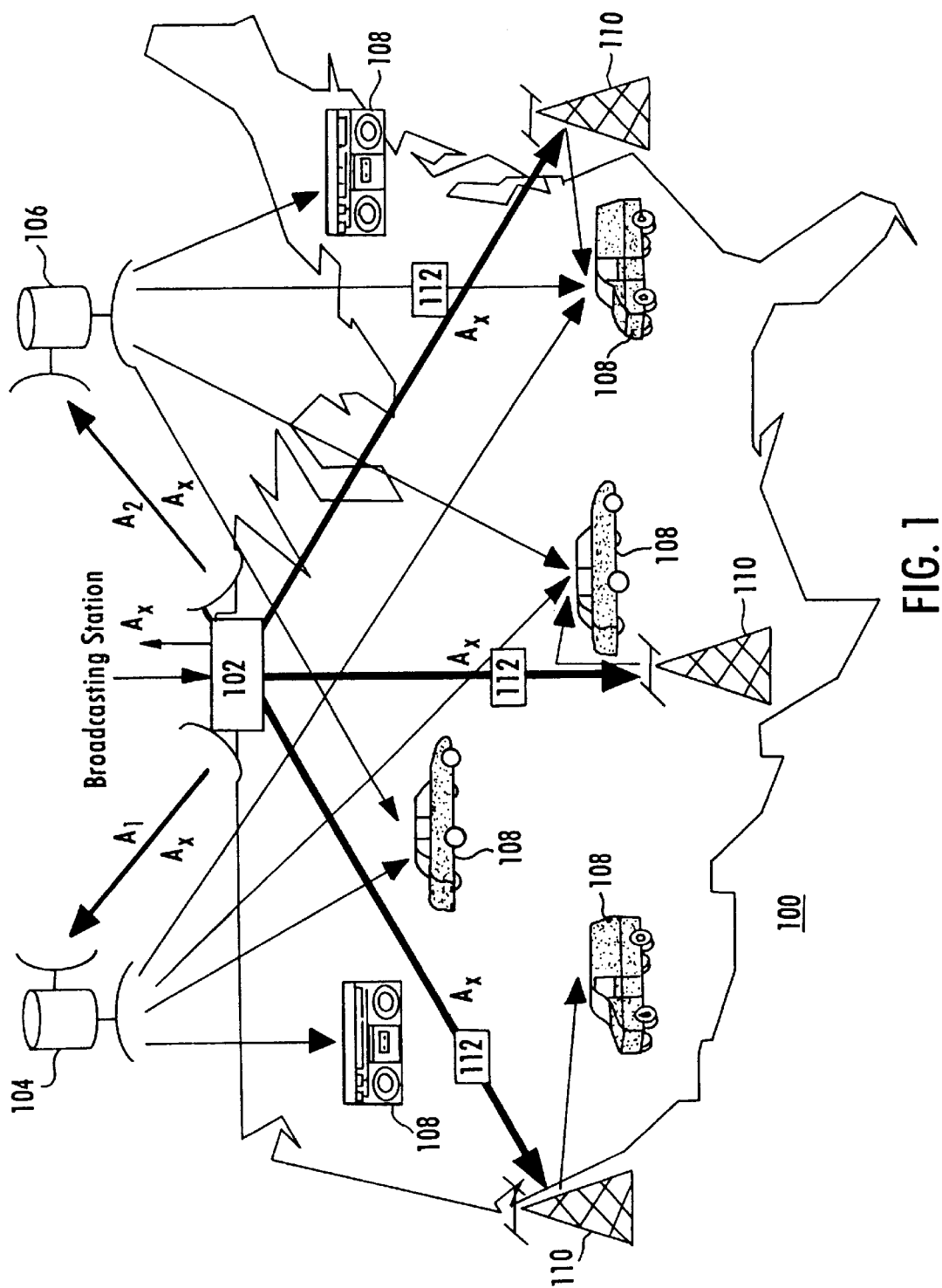
FIG. 1 is a schematic illustration of a DAB method and system.

As illustrated in FIG. 1, a DAB system 100 is described according to an embodiment of the present invention. The DAB system 100 provides for the improved digital broadcasting of a signal having program data and information, such as, for example, digital radio information, CD Quality Audio, Messaging, Internet downloads and the like. The DAB system 100 has an uplink earth station or transmitter 102 designed for fixed—feeder transmission (SHF or higher frequency) to a plurality of separately spaced satellites in geosynchronous orbits, which for ease of illustration are shown by dual satellites 104 and 106. The transmitter 102 can provide a plurality of uplink audio data signals $A_x$, for example, uplink signals $A_1$ and $A_2$ to each of satellites 104 and 106 spaced apart in a geosynchronous orbit. Such satellite transmissions can be by way of fixed-feeder transmission links to the geosynchronous satellites or to a web or network of low orbital satellites enabling switching transmission such as GPS and the like. The DAB system 100 also has a plurality of receivers 108, whether fixed or mobile, for receiving such audio data signals $A_x$ after they are retransmitted to a footprint or coverage area represented as a plurality of downlink paths from the satellites 104 and 106. The DAB system 100 advantageously can broadcast signals $A_x$ terrestrially from the uplink station 102 to a plurality of gap fillers 110 along land-lines, optical networks, microwave ground networks or the like. The gap fillers 110 transmit both uplink signals $A_1$ and $A_2$ in connection with a continuously adaptive propagation delay scheme to accommodate timing shifts caused by variations in the satellite paths. Gap fillers operate to fill gaps in the reception of the satellite signal data, for example, high density areas having acute problems of fading or shadowing. Such gaps can be the result of signal path blockage or fading such as, for example, urban areas where there is a high probability that buildings will block signals $A_1$ or $A_2$, or both.

The adaptive propagation delay 112 system compensates for the difference between the propagation delay through satellites and the propagation delay through the terrestrial gap filler 112 network. The delay system includes, in this case, two delays; one to align the gap filler's transmission of the $A_1$ signal with the $A_1$ signal transmitted by satellite 104, and one to align the gap filler's transmission of the $A_2$ signal with the $A_2$ signal transmitted by satellite 106. The arrival delay spread of the signals from satellites, gap filler transmitter, and reflected multipaths is thereby maintained within one bit period to preserve the orthogonality of the synchronous OCDMA system, to eliminate self-interference at the RAKE receiver. In this manner, the DAB system 100 can transmit the audio data signals. Additionally, the present invention advantageously can allow for the transmission and reception of the digitized program data and information in a highly efficient, reliable and cost effective manner, so as to better manage transmitter power and bandwidth resources.

According to an embodiment of the present invention, the DAB system 100 utilizes a time diversity scheme that implements a Turbo Code (TC) iterative channel coding scheme. The Turbo Coding scheme combines several simple codes in parallel to communicate audio program data and information in the signals to each uplink path $(A_1, A_2)$ so as to provide for receiver performance at or near theoretical Shannon's limit, such as, for example, in the range of 0.3 to 0.7 dB signal-to-noise ratio at a bit error rate of $10^{-5}$ for the Binary Phase Shift Keying (BPSK) modulation scheme. The DAB system 100 advantageously provides a high performance TC scheme achieving the code rate of ¼ as described herein in relation to FIGS. 2–4. In this manner, the present invention advantageously provides temporal diversity through a TC implementation, thereby reducing the satellite transmitter output power and resulting in improved coverage area with a minimum number of gap fillers.

Figure 2:
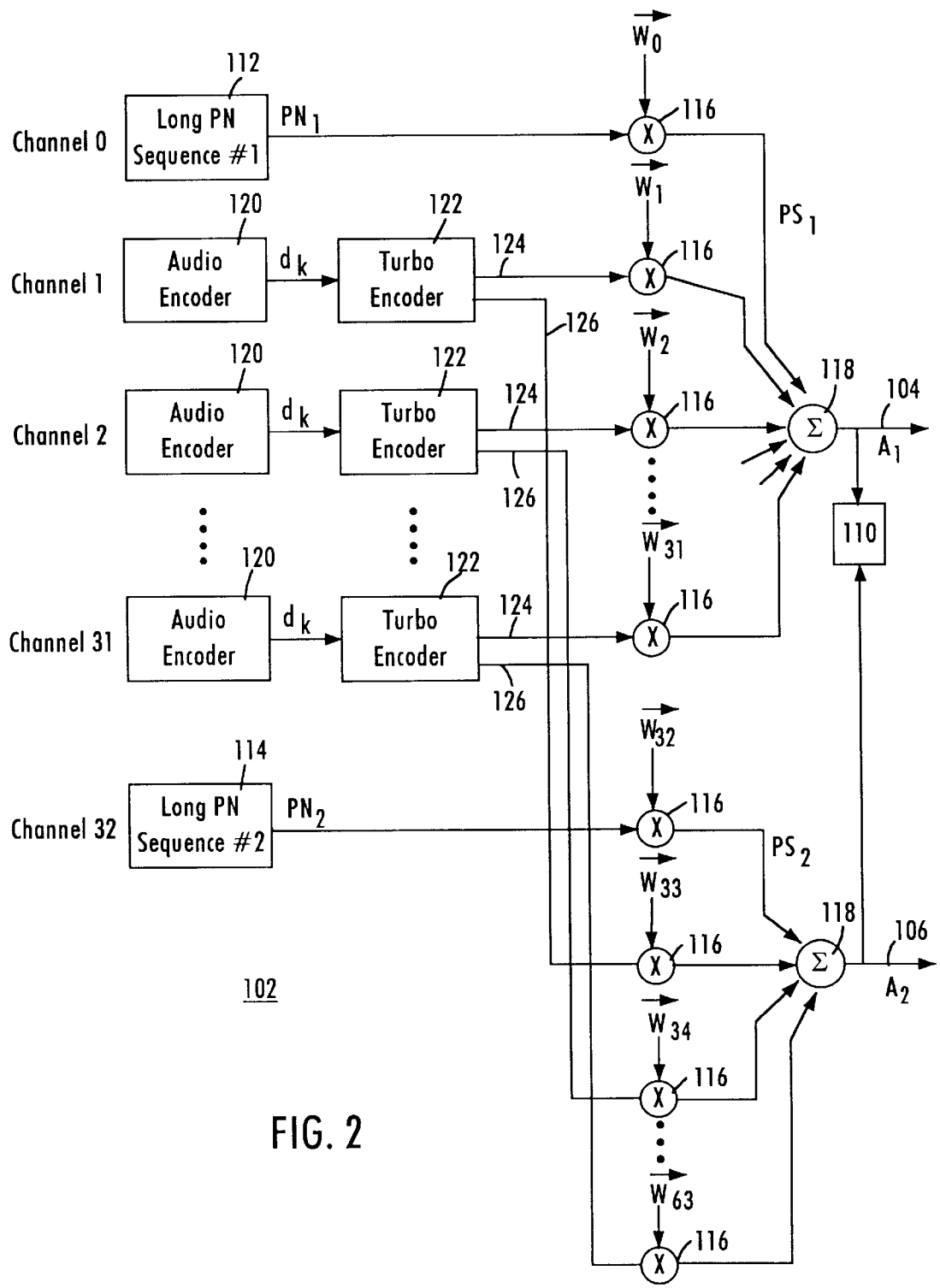
FIG. 2 illustrates a DAB transmission method and system indicating the flow of audio data in the DAB system.

As shown in FIG. 2, the transmitter 102 includes a plurality of channels for sending the audio data signal, for example, a 31 Channel DAB transmission system. For ease of illustration, Channels 3 through 30 are not shown. The transmitter 102 includes pilot signal generators 112 and 114 for generating pilot signals PS1 and PS2. The pilot signal generators send pseudo-random noise (PN) sequences $PN_1$ and $PN_2$ on Channels 0 and 32. The PN sequences $PN_1$ and $PN_2$ are spread by Walsh codes $W_0$ and $W_{32}$. Subsequently, pilot signal $PS_1$ on Channel 0 is combined with the first turbo encoded audio signal and sent as a first turbo encoded broadcast signal via signal path $A_1$. Pilot signal $PS_2$ on and Channel 32 is combined with a second turbo encoded audio signal and sent as a second turbo encoded broadcast signal via signal path $A_2$. The pilot signals are transmitted at a higher power or rate than the individual signals of the audio data channels. Pilot signals $PS_1$ and $PS_2$ are used by the receiver 108 to acquire and maintain synchronization of the first and second turbo encoded broadcast signals for each channel on the $A_1$ and $A_2$ paths, and to obtain the predetermined number of strongest multipath signals for the RAKE receiver.

Figure 3:
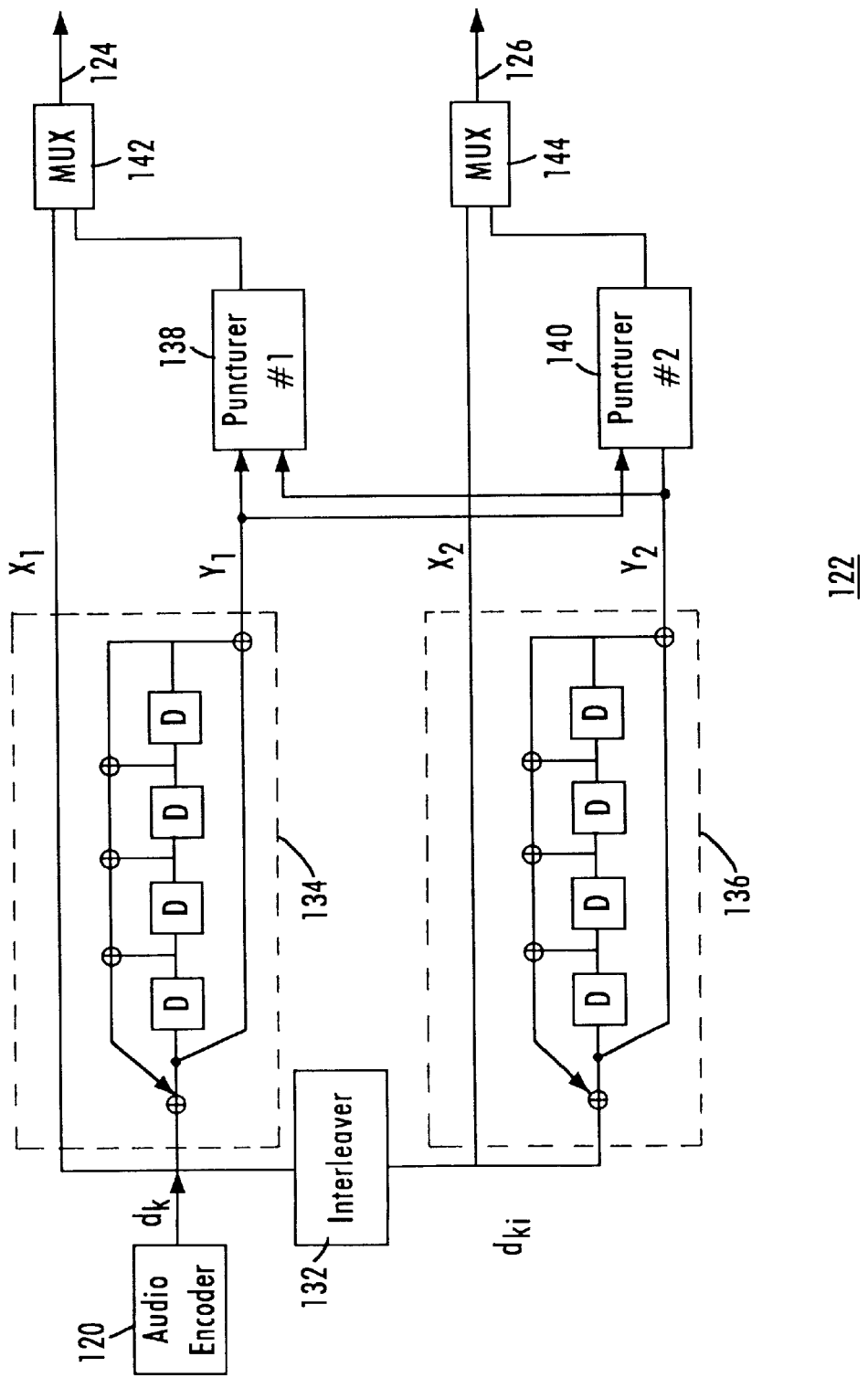
FIG. 3 illustrates a method and system of turbo encoding the program data signal for transmission of a channel of audio data in relation to FIG. 2.

As is illustrated in FIGS. 2 and 3, the transmitter 102 provides Channels 1 through 31 with the broadcast programming or digital audio data and information from the source channels to respective audio encoders 120. The output of each audio encoder for channels 1–31 is provided to a turbo encoder 122. Each turbo encoder 122 has two separate outputs designated 124 and 126. Non-interleaved outputs multiplexed with parity bits on output 124 are spread by Welsh codes $W_1$ through $W_{31}$ and combined together with the spread pilot signal $W_0$, for transmission as signal $A_1$ to satellite 104 and to the gap filler 110. Interleaved outputs are similarly multiplexed with parity bits on output 126, are spread with Walsh codes $W_{33}$ and $W_{63}$ and combined with the other spread pilot signal $W_{32}$, for transmission as signal $A_2$ to satellite 106, and to the gap filler 110.

The spread circuitry 116 operates according to an orthogonal Code Division Multiple Access (OCDMA) scheme to spread the PN sequences generated for pilot signals $PS_1$ and $PS_2$, encoded audio program data and information, or interleaved encoded audio program data and information with a Walsh code sequence in a known manner and represented herein by the sequence $W_0, W_1, W_2, \ldots W_{63}$ for a system supporting 31 channels of CD-quality stereo audio. The pilot signals $PS_1$ and $PS_2$ generated for Channels 0 and 32 are directly spread by the Walsh sequences $W_0$ and $W_{32}$ without turbo encoding. Encoded audio data and information on Channels 1 through 31 are spread and sequenced with Welsh codes $W_1$ through $W_{31}$ for transmission via the $A_1$ path. Similarly, encoded and interleaved audio data and information on channels 33 through 63 are spread and sequenced with Walsh codes $W_{33}$ through $W_{63}$ for transmission via the $A_2$ path. All 64 Walsh sequences are generated by the Hadamard matrix, and each sequence is thus orthogonal to every other sequences including delayed versions of itself, unless the delay spread exceeds one bit period. The orthogonality results in the self interference free spread spectrum operation of the OCDMA. The spread circuitry 116 outputs the spread sequence of Channels 0 through 31 to the combiner 118 for ultimate transmission to satellite 104 and to the gap filler 110, and Channels 32 through 63 to combiner 118 for ultimate transmission to satellite 106 and to gap filler 110.

As shown in FIG. 3, the turbo encoder 122 includes an interleaver 132 between two constituent recursive convolutional encoders 134 and 136 to permute incoming digital audio information sequence in random fashion. The permutation breaks the cross correlation between the two turbo encoded sequences. The operation of the constituent encoders 134 and 136 can be described by the polynomial representation, $$(1, g_1/g_2) = (1, 1+D^4/1+D+D^2+D^3+D^4) \quad (1)$$

Conventional octal representation for the illustrated code is $(g_1, g_2)=(21, 37)$. Here, the $g_1$ represents the feed forward connection, and the $g_2$ represents the feed back connection. The constituent codes are illustrated as identical with each having four memory elements (D). However, the present invention is not limited by this particular polynomial nor by the number of memory elements. The parity sequence outputs of two encoders 134 and 136 are input to puncturers 138 and 140 to generate two different punctured sequences described in greater detail in FIG. 4. These punctured parity sequence outputs are multiplexed with $X_1$ and $X_2$ representing the unaltered source sequences $d_k$ and $d_{ki}$ at MUX 142 and at MUX 144, respectively. The turbo encoder 122 associated with each audio channel can advantageously process broadcast programming or encoded audio data according to puncturing patterns discussed herein to combine the audio data and the parity data onto two carriers for subsequent advantageous use by an iterative decoding process in the turbo decoder 172 of each receiver 108.

In operation, the original audio program data sequences, represented as $d_k$ in FIG. 3, are supplied to the turbo encoder 122, which outputs an unaltered copy of the systematic audio data $X_1$ to one input of MUX 142. The audio data $d_k$ is also supplied to the first constituent recursive encoder 134, which supplies parity output $Y_1$, to one input of the first puncturer 138 and to one input of the second puncturer 140. The audio data $d_k$ are also supplied to interleaver 132. The second constituent encoder 136 is supplied with an interleaved audio program data signal $d_{ki}$. Unaltered interleaved signal $d_{ki}$ is supplied in systematic form as sequence $X_2$ to one input of MUX 144 for ultimate transmission to signal path 126. A copy of $d_{ki}$ is supplied to the second constituent encoder 136, which encodes each interleaved bit of audio data and generates a parity sequence $Y_2$ which is supplied to both puncturers 138 and 140.

The parity outputs $Y_1$ and $Y_2$ generated by audio data $d_k$ and $d_{ki}$ are punctured according to the puncturing pattern $$\begin{bmatrix} 0 & 1 \\ 1 & 0 \end{bmatrix}$$

by the first puncturer 138 in an alternating $y_1$ and $y_2$ bit output sequence. The parity outputs $Y_1$ and $Y_2$ generated by program data $d_k$ and $d_{ki}$ are punctured according to the puncturing pattern $$\begin{bmatrix} 1 & 0 \\ 0 & 1 \end{bmatrix}$$

by the second puncturer 140 in an alternating $y_2$ and $y_1$ bit output sequence. In this manner, according to an embodiment of the present invention, the DAB system 100 has a puncturing code rate of ½ for each signal path $A_1$ and $A_2$. By transmitting the uninterleaved systematic sequence $X_1$ and interleaved systematic sequence $X_2$ in conjunction with code diversity combining at the receiver, overall code rate ¼ is achieved to provide improved performance over the known DAB systems.

Figure 4:
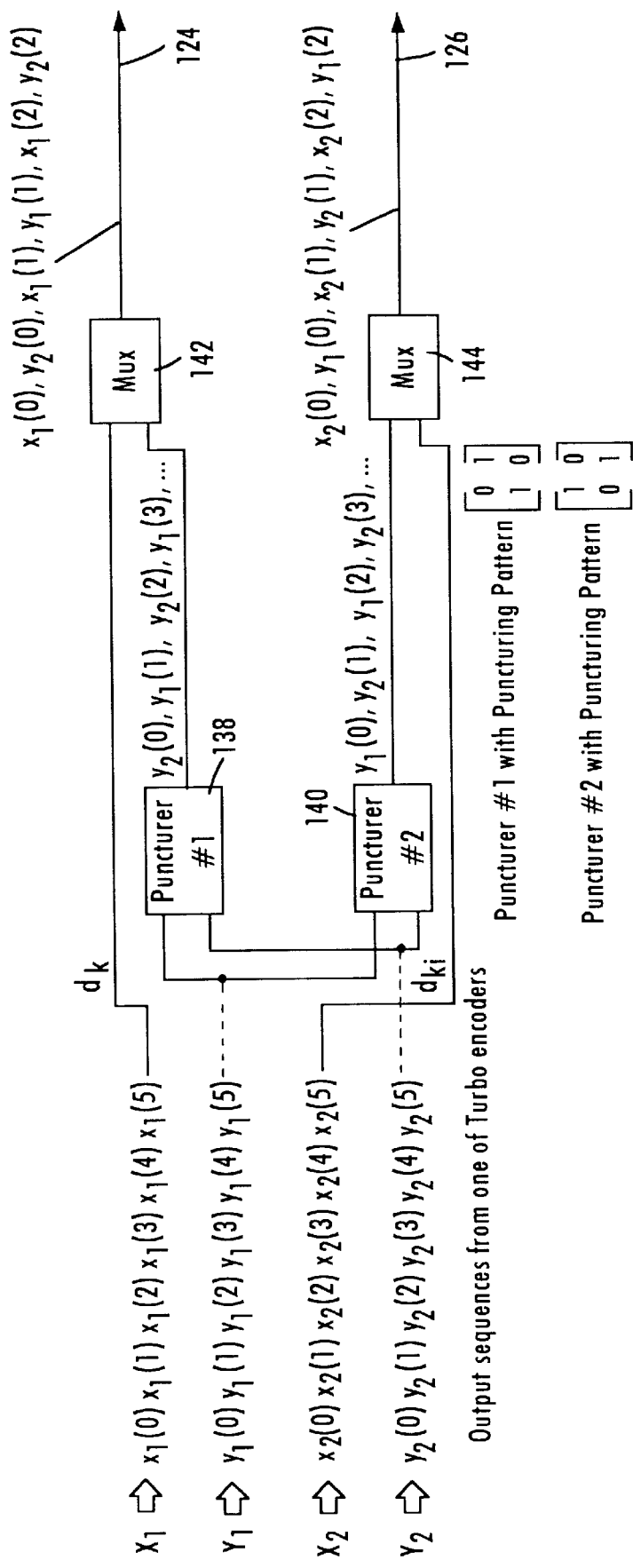
FIG. 4 illustrates and is used in explaining the method of implementing a punctured pattern for the output of the turbo encoder and the creation and subsequent transmission of the two complementary data signals in relation to FIGS. 2 and 3.

The puncturing pattern for the output of the turbo encoder 122 is described in FIG. 4. The turbo encoded audio data signal to be transmitted is represented by data bits sequences $X_1, Y_1, X_2, Y_2$ throughout this discussion so as to illustrate the turbo code method of the present invention. The unaltered audio data and information $d_k$, represented as $X_1$, has a sequence of $$X_1 => x_1(0), x_1(1), x_1(2), x_1(3) \ldots, x_1(n) \text{ where n=the bit timing index} \quad (2)$$

Similarly, the second interleaved unaltered audio data and information $d_{ki}$ is represented as $X_2$, and has a sequence of $X_2 => x_2, (0), x_2(1), x_2(2), x_2(3), x_2(n)$ where n= the bit timing index (3)

The first constituent encoder 134 generates the systematic sequence output $X_1$ and the parity sequence output $Y_1$ using uninterleaved sequence $d_k$, and the second constituent encoder 136 generates the systematic interleaved sequence $X_2$ and parity sequence output $Y_2$ using the interleaved sequence $d_{ki}$, whereby each parity sequence output has a sequence of $Y_1 => y_1(0), y_1, (1), y_1(2), y_1(3), \ldots, y_1(n)$ where n=the bit timing index (4)

$Y_2 => y_2(0), y_2,(1), y_2(2), y_2(3), \ldots, y_2(n)$ where n=the bit timing index (5)

As the puncture pattern is applied to the $Y_1$ and $Y_2$ sequences by puncturers 138 and 140, the output of the first puncturer 138 has a sequence of $y_2(0), y_1, (1), y_2(2), y_1(3), \ldots$ (6)

as a result of the puncturing pattern $$\begin{bmatrix} 0 & 1 \\ 1 & 0 \end{bmatrix}.$$

The output of the second puncturer 140 has a sequence of $y_1(0), y_2, (1), y_1(2), y_2(3), \ldots$ (7)

As a result of the puncturing pattern $$\begin{bmatrix} 1 & 0 \\ 0 & 1 \end{bmatrix}.$$

The resulting punctured outputs 138 and 140 are multiplexed with sequence $X_1$ and $X_2$ at MUX's 142 and 144, respectively. The outputs of the two encoders 134 and 136 yield the code rate ¼ overall, and are punctured and multiplexed into two separate signal paths 124 and 126, each with the individual code rate of ½. Accordingly, the output sequence from MUX 142 is represented as $x_1(0), y_2(0), x_1(1), y_1(1), x_1(2), y_2(2), \ldots$ (8)

The output sequence of the MUX 144 is represented as:

$x_2(0), y_1(0), x_2(1), y_2(1), x_2(2), y_1(2), \ldots$ (9)

The output of MUX 142 is transmitted to the first satellite 104 and the output of MUX 144 is transmitted to the second satellite 106, after the spreading and combining processes are performed on each of the half-channels associated with the uplink portion of the DAB system. Thereafter, at the receiver, if both signals $A_1$ and $A_2$ are available, the code combining and code diversity of the present invention achieves an overall code rate of ¼, based on one interleaved bit and two parity bits per one input encoded bit $d_k$.

In addition to the improved performance from the code rate of ¼, other advantages include reduction or elimination of fading, shadowing and/or other loss of data transmitted in the signal. For example, performance of conventional DAB systems are compromised because the same signal is sent from each satellite, wasting valuable power and create multiple access noise interference. If the code rate ½ signal from the first satellite is not available, the conventional receiver receives the same signal from second satellite and overall performance is limited to code rate ½. In the DAB system 100 of the present invention, the signal from the second satellite 106 will have all the information necessary for estimating the missing audio data from the first satellite 104 and successfully performing the iterative algorithm. Through this iterative process, the performance of the receiver is greatly improved.

Figure 5:
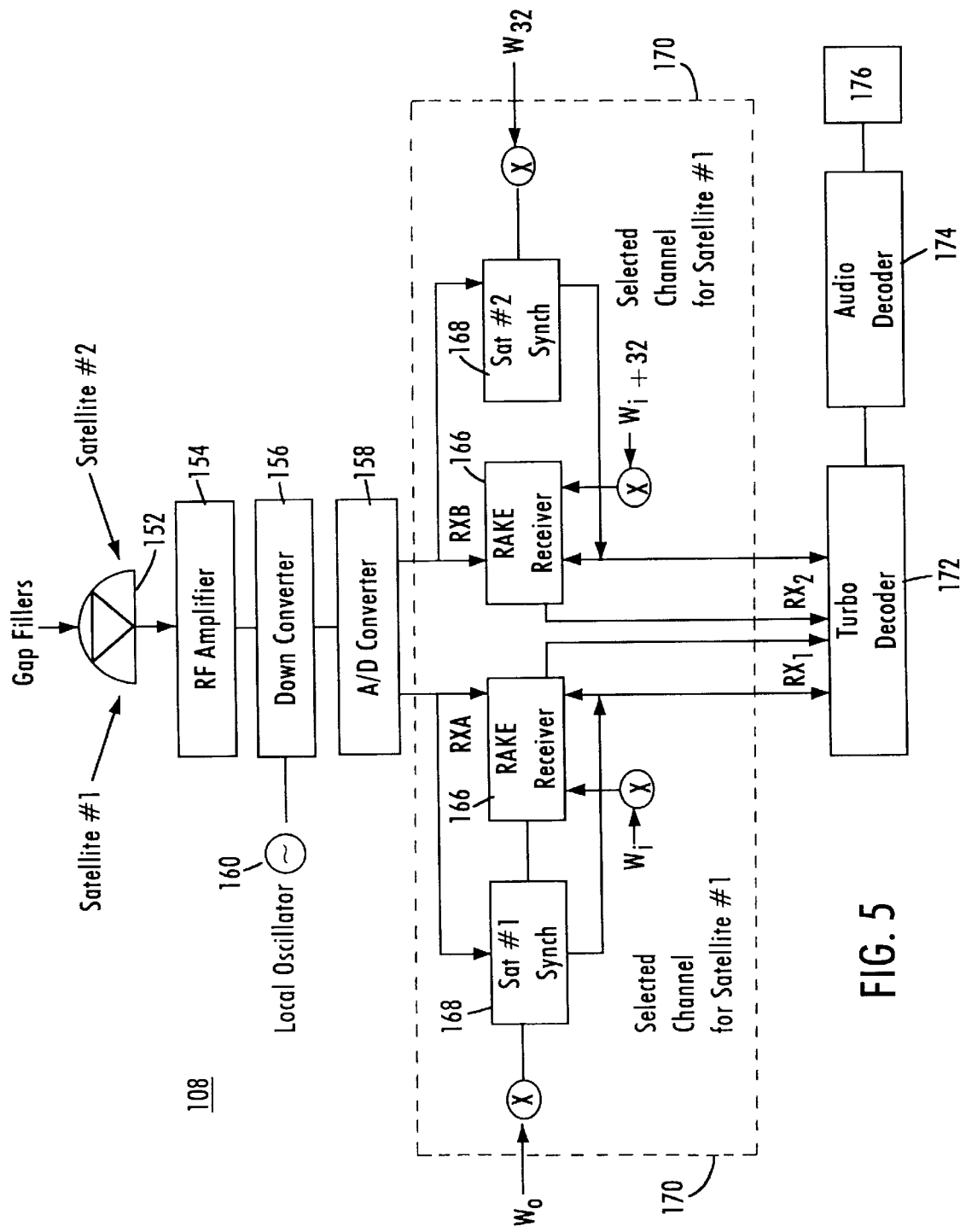
FIG. 5 illustrates a DAB receiver and method of receiving the audio data signals in the DAB system.
Figure 6:
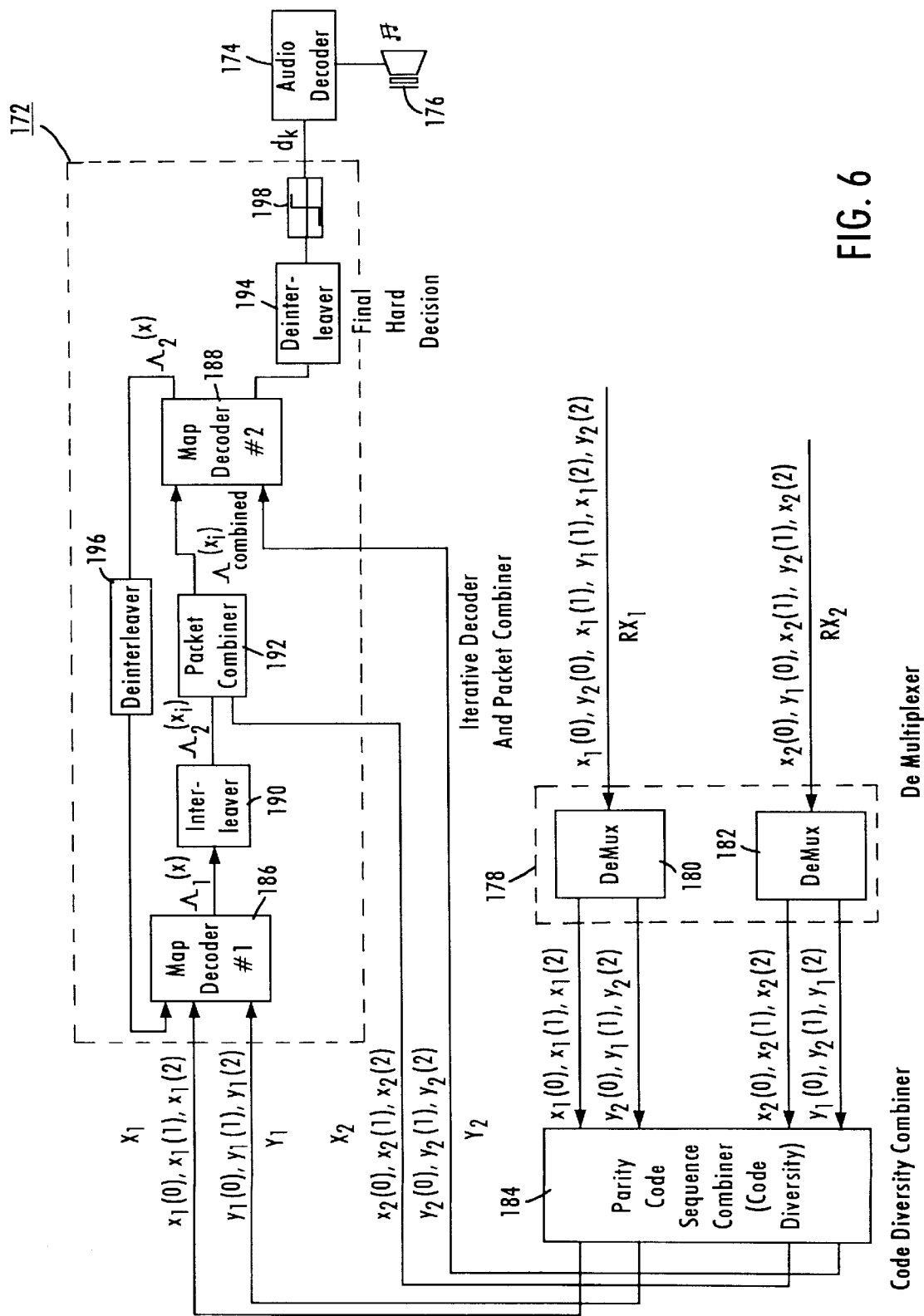
FIG. 6 illustrates and is used in explaining a method of decoding the audio data signal received in relation to FIG. 5.

Referring to FIGS. 5 and 6, an embodiment of the fixed or mobile receivers 108 of the present invention is illustrated by diagram 150 whereby the DAB system 100 advantageously uses a DAB receiver 150 to receive and decode the two transmitted turbo encoded audio data signals. The DAB receiver 150 can utilize two RAKE receivers or the like. The DAB receiver 150 can be in a fixed or mobile platform and have an antenna 152 which accepts two OCDMA radio frequency (RF) transmissions of turbo encoded broadcast signals $A_1$ and $A_2$ (whether from each of satellites 104 and 106 and /or both of the signal sets from gap filler 110). The DAB receiver 150 also has radio frequency (RF) amplification circuitry 154, down conversion circuitry 156, analog-to-digital (A/D) converters 158, tuning circuitry for the desired channel, a turbo decoder (including code diversity combining circuitry 170, and code combining circuitry 172), as shown in greater detail in FIG. 6, and audio decoder circuitry 174. The present invention uses RAKE receiver structure to combine a predetermined number of multipath signals from satellite and/or gap filler signals according to their signal strengths. Additionally, the present invention manipulates the time alignment of the gap filler signal so as to substantially correspond with the arrival of an identical satellite signal, whereby each is seen to be a multipath of the other, and the RAKE receiver provides the signal summation effect that is lacking in conventional strongest-signal-selection methods.

In FIG. 5, antenna 152 is a hemispherical coverage antenna for use with the fixed and/or mobile DAB system 100 of the present invention. Received spread signal from the antenna 152 is supplied to the RF amplifier stage 154 for amplification. Output from RF amplifier 154 is supplied to the down converter circuitry 156. The down converter circuitry 156 converts the RF signal to baseband signals $A_1$ and $A_2$ from satellites 104 and 106 and/or gap filler 110 using conventional techniques with locally generated oscillator frequency 160. The local oscillator operates to translate the carrier frequency of the received data signal to baseband or to a predetermined Intermediate Frequency (IF). After conversion to baseband or IF, it is sampled and quantized to a digital bit stream by the operation of conventional A/D converter 158. The sampling rate of the A/D converter is twice the chip rate to maintain signal integrity. The digitally converted signal is then supplied from A/D converter to both RAKE receivers 166 and synchronization circuitry 168.

The demodulator 170, is the combination of synchronization circuits 168 and RAKE receivers 166. The synch circuit 168 acquires synchronization by despreading the pilot signals of signal paths $A_1$ and $A_2$, separately represented in FIG. 5 as RXA and RXB respectively, by multiplying pilot signal Welsh sequences $W_0$ and $W_{32}$. The synch circuits 168 for each signal path $A_1$ and $A_2$ receive despread baseband signals and correlates with the long PN sequence pilot channels to properly acquire the frame synch indicating the frame epoch time. The synch circuit 168 identifies out of synch conditions between signal paths $A_1$ and $A_2$ to provide the synchronization information to the turbo decoder 172. The RAKE receivers 166 rely on the orthogonal spreading sequences $W_0$ through $W_{63}$, which are designed to provide zero correlation between sequences, to combine the satellite, gap filler, and multipath signals without self interference. When these multiple components are delayed in time by more than a chip duration, but less than one bit period, they appear like uncorrelated noise at the OCDMA receiver, and are combined in order to improved the signal to noise ratio at the receiver. The RAKE receiver attempts to collect the time-shifted versions of the original signal by providing a separate correlation receiver for each of the incoming signals over signal paths $A_1$ and $A_2$. Each RAKE receiver 166 combines a predetermined number of strongest signals. The outputs RX1 and RX2 of the RAKE receivers 166 are tuned by the selecting a spreading sequence pair $W_i$ and $W_{i+32}$ so as to despread each signal and supply it to the turbo decoder 172. The output of the turbo decoder is supplied to the audio decoder 174 which feeds an output device 176 such as an amplifier and speaker. According to the method of the present invention, the demodulated encoded program data sequences $(X_1, Y_1, X_2, Y_2)$ are supplied to the turbo decoder 172. For example, the $RX_1$ input at the turbo decoder 172 comprises the sequence of $x_1(0), y_2(0), x_1(1), y_1(1), \ldots$ and the $RX_2$ input of the turbo decoder 172 is fed the set $x_2(0), Y_1(0), x_2(1), y_2(1), \ldots$ as had been transmitted thereby. Ultimately, these signals are processed to form a very reliable audio data signal sequence which is then supplied to the audio decoder 174.

As is illustrated in FIG. 6, the turbo decoder 172 of the present invention advantageously performs demultiplexing to separate systematic audio data sequences from the multiplexed signals and depunctures parity check sequences. Through this depuncturing and reshuffling processes, code combining is achieved. The turbo decoder 172 includes a de-multiplexer stage 178 having de-multiplexers 180 and 182 that demultiplex each of the Channels $RX_1$ and $RX_2$ respectively. As will be appreciated the input signals to the demultiplexers 180 and 182 are estimations of the encoded audio data signal sequences corrupted with channel noise and other external factors. For example, the input to demultiplexer 180 is:

$$x_1(0), y_2(0), x_1(1), y_1(1), x_1(2), y_2(2) \ldots \quad (10)$$

Similarly, the input to demultiplexer 182 is:

$$x_2(0), y_1(0), x_2(1), y_2(1), x_2(2), y_1(2) \ldots \quad (11)$$

Each of the demultiplexers 180 and 182 separates the $RX_1$ and $RX_2$ data into systematic audio data information sequences and punctured parity check data sequences. The code combiner 184 depunctures and achieves the code diversity combining so as to output systematic forms of uninterleaved audio signal sequence $X_1$ and depunctured parity sequence $Y_1$ to the first MAP decoder 186 which is symmetric to the first recursive systematic convolutional encoder 134 of the turbo encoder 122. The code combiner 184 also outputs systematic forms of interleaved audio signal sequence $X_2$ and corresponding depunctured parity sequence $Y_2$ to the packet code combiner 192 and depunctured parity sequence to the second MAP decoder 188. For example, input signals to the code combiner 184 from each of the demultiplexers 180 and 182 are:

$$x_1(0), x_1(1), x_1(2), \ldots y_2(0), y_1(1), y_2(2), \ldots \quad (12)$$

$$x_2(0), x_2(1), x_2(2), \ldots y_1(0), y_2(1), y_1(2), \ldots \quad (13)$$

Outputs from the code combiner 184 are the reshuffled signals:

$$x_1(0), x_1(1), x_1(2), \ldots y_1(0), y_1(1), y_1(2), \ldots \quad (14)$$

$$x_2(0), x_2(1), x_2(2), \ldots y_2(0), y_2(1), y_2(2), \ldots \quad (15)$$

The output from previously uninterleaved audio signal data (represented by equation 14), is supplied to the first MAP decoder 186. The MAP decoder 186 further receives a feedback loop from the second MAP decoder 188 as is defined herein. Previously estimated audio data sequence which improves the reliability of successive iterations. This reliability information and feedback loop has been depicted as "extrinsic information" in the turbo code literature and is well understood.

The MAP decoders 186 and 188 are known in the art as powerful constituent Maximum A Posteriori Probability (MAP) decoders. On the first iteration, the MAP decoder 186 accepts the input of $(X_1, Y_1)$ sequences as supplied by the code combiner 184 and the feedback signal is set to a neutral value (set to "zero"). The output of the first MAP decoder 186 is indicative of extrinsic information of the original audio data signal $d_k$ which is the reliability of the decoded audio data sequence and is represented as $\Lambda_1^{(x)}$. The information signal is supplied to an interleaver 190 to interleave the information according to the original interleaver 132 in FIG. 3.

The output signal $\Lambda_1^{(xi)}$ from the interleaver 190 is fed to the packet combiner 192 and is combined with the $X_2$ estimated interleaved audio data sequence from the code diversity combiner 184. The packet combiner is a significant improvement over prior art and functions or operates to combine the $d_k$ estimated audio data information of $\Lambda_1^{(xi)}$ and the received $d_{ki}$ information. The signal output from the packet combiner is supplied to one input of the second MAP decoder 188. The packet combiner combines two independent estimated sequences by adding the value of a log-likelihood ratio $\Lambda_1^{(xi)}$ as a Posteriori probability and the reliability information regarding $X_2$ from the channel. Combined interleaved audio data reliability information $\Lambda_{combined}^{(xi)}$ is supplied to another input of the MAP decoder 188. The second MAP decoder 188 operates on the $\Lambda_{combined}^{(xi)}$ information and $Y_2$. The second MAP decoder 188 also outputs the reliability data about $d_{ki}$ as an extrinsic feedback signal $\Lambda_2^{(x)}$ to the first MAP decoder 186 so as to supply some estimation information about the $d_k$ input for successive iterations. The $\Lambda_2^{(xi)}$ is supplied to deinterleavers 194 and 196 (of the feedback loop) which operates to undo the interleaving of the estimated audio data sequence to $d_k$. The second deinterleaver 194 supplies the final $d_k$ estimation output signal to a hard limiter 198. The hard limiter operates in a known manner on the supplied signal to form $d_k$ after a predetermined number of iterations, so as to output one of two binary states, for example, everything above zero is assigned +1, everything below is assigned −1. The $d_k$ signal is supplied to the audio decoder 174 to decode the audio data signal and to supply it to a loudspeaker 176 for listening by a user.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, the invention can be applied to any wide area broadcasting applications using multiple signal paths, such as nationwide digital TV and audio broadcasting and digital information download services. Additionally, the invention can be utilized a network of low-orbital communications satellites, for example, GPS or other systems for transmissions of the first and second broadcast signals $A_1$ and $A_2$ thereto.

I claim:

1. A digital receiver comprising:

receiver circuitry for processing received modulated signals to obtain first and second data streams if contained within currently received signals;

a first demultiplexer, coupled to an output of the receiver circuitry, for processing the first data stream if received to recover digital data corresponding to digital source information and a first coded sequence;

a second demultiplexer, coupled to an output of the receiver circuitry, for processing the second data stream if received to recover digital data corresponding to interleaved digital source information and a second coded sequence;

a code combiner, coupled to the first and second demultiplexers, for processing the first and second code sequences if available, to recover a first turbo encoded sequence corresponding to the digital source information and a second turbo encoded sequence corresponding to the interleaved digital source information; and an intelligent turbo decoder for recovering an accurate representation of the digital source information from an available two or more of: the digital data corresponding to the digital source information, the first turbo encoded sequence, the digital data corresponding to the interleaved digital source information, and the second turbo encoded sequence.

2. A digital receiver as in claim 1, wherein the intelligent turbo decoder processes the digital data corresponding to the digital source information, the first turbo encoded sequence, the digital data corresponding to the interleaved digital source information and the second turbo encoded sequence, if the first and second data streams are contained within currently received signals.

3. A digital receiver as in claim 1, wherein the intelligent turbo decoder processes the digital data corresponding to the digital source information and portions of the first and second turbo encoded sequences derived from the first coded sequence, if only the first data stream is contained within currently received signals.

4. A digital receiver as in claim 1, wherein the intelligent turbo decoder processes the digital data corresponding to the interleaved digital source information and portions of the first and second turbo encoded sequences derived from the second coded sequence, if only the second data stream is contained within currently received signals.

5. A digital receiver as in claim 1, wherein the receiver circuitry comprises first and second RAKE receivers using first and second despreading codes to recover the first and second data streams from received spread spectrum signals.

6. A digital receiver as in claim 1, wherein the code combiner comprises a code diversity combiner.

7. A digital receiver as in claim 1, wherein the intelligent turbo decoder comprises:

a first decoder coupled to outputs of the code combiner corresponding to the digital source information and the first turbo encoded sequence;

a packet combiner combines two independent data streams from an output of the first decoder and an output of the code combiner corresponding to the interleaved digital source information; and a second decoder responsive to an output of the packet combiner and an output of the code combiner corresponding to the second turbo encoded sequence.

8. A digital receiver as in claim 7, wherein the intelligent turbo decoder further comprises:

a interleaver coupling digital output information from the first decoder to an input of the packet combiner;

a first deinterleaver providing feedback from the second decoder to the first decoder; and a second deinterleaver for deinterleaving an output from the second decoder.

9. A digital receiver as in claim 8, further comprising a signal decoder responsive to data output from the second deinterleaver for producing a signal to drive an output device for presenting information to a user of the receiver.

10. A digital receiver as in claim 9, wherein the signal decoder comprises an audio decoder for generating an analog audio signal.

11. A digital receiver as in claim 7, wherein the first and second decoders comprise MAP decoders.

12. A product comprising a machine readable medium bearing sequences of digital code, said sequences digital code comprising:

a first multiplexed data stream containing digital source information and a first encoded sequence; and a second multiplexed data stream containing interleaved digital source information and a second encoded sequence, wherein:

the first encoded sequence comprises a combination of selected portions of a first turbo code derived from the digital source information and selected portions of a second turbo code derived from the interleaved source information, and the second encoded sequence comprises a combination of alternate portions of the first turbo code derived from the digital source information and alternate portions of a second turbo code derived from the interleaved source information.

13. A product as in claim 12, wherein the medium comprises at least one modulated electromagnetic wave.

14. A receiver for receiving and decoding digital data, wherein said digital data comprises:

a first multiplexed data stream containing digital source information and a first encoded sequence; and a second multiplexed data stream containing interleaved digital source information and a second encoded sequence, wherein:

the first encoded sequence comprises a combination of selected portions of a first turbo code derived from the digital source information and selected portions of a second turbo code derived from the interleaved source information, and the second encoded sequence comprises a combination of alternate portions of the first turbo code derived from the digital source information and alternate portions of a second turbo code derived from the interleaved source information, said receiver comprising:

(a) processing circuitry for recovering the first data stream if contained in received broadcast signals and for recovering the second data stream if contained in the received broadcast signals; and (b) an intelligent turbo decoder coupled to the processing circuitry, for decoding the first and second data streams to recover a representation of the digital source information if both data streams are received, and for decoding either the first data stream or the second data stream to recover a representation of the digital source information if only one of the data streams are received.

15. A receiver for receiving and decoding digital data, comprising:

receiver circuitry for processing received modulated signals from one or both of a first channel and a second channel, to recover digital data corresponding to digital source information and a first coded sequence if the first channel is received, and to recover digital data corresponding to interleaved digital source information and a second coded sequence if the second channel is received;

a code combiner, coupled to the receiver circuitry, for processing the first and second code sequences if available, to recover a first turbo encoded sequence corresponding to the digital source information and a second turbo encoded sequence corresponding to the interleaved digital source information;

a first decoder, coupled to the code combiner, for processing data corresponding to the digital source information and to the first turbo encoded sequence to produce a first estimation;

a packet combiner for forming a ratio as a function of the first estimation and data corresponding to the interleaved digital source information; and a second decoder for producing a second estimation from an output of the packet combiner and an output of the code combiner corresponding to the second turbo encoded sequence and outputting the second estimation.

16. A receiver as in claim 15, further comprising an interleaver, coupled between an output of the first decoder and an input of the packet combiner, for interleaving a data stream representing the first estimation and supplying interleaved data to an input of the packet combiner.

17. A receiver as in claim 15, further comprising:

a deinterleaver, coupled to the output of the second decoder, for deinterleaving data representing the second estimation; and a signal decoder, responsive to data output from the deinterleaver, for producing a signal to drive an output device for presenting information to a user of the receiver.

18. A digital receiver as in claim 17, wherein the signal decoder comprises an audio decoder for generating an analog audio signal.

19. A receiver as in claim 15, further comprising a deinterleaver providing feedback from the second decoder to the first decoder.

20. A digital receiver comprising:

receiver circuitry for processing received modulated signals from one or both of a first channel and a second channel, to recover digital data corresponding to digital source information and a first coded sequence if the first channel is received, and to recover digital data corresponding to interleaved digital source information and a second coded sequence if the second channel is received;

a code combiner, coupled to the receiver circuitry, for processing the first and second code sequences if available, to recover a first turbo encoded sequence corresponding to the digital source information and a second turbo encoded sequence corresponding to the interleaved digital source information; and an intelligent turbo decoder for recovering an accurate representation of the digital source information from an available two or more of: the digital data corresponding to the digital source information, the first turbo encoded sequence, the digital data corresponding to the interleaved digital source information, and the second turbo encoded sequence.

* * * * *